(12) United States Patent
Adachi et al.

(10) Patent No.: US 10,600,608 B1
(45) Date of Patent: Mar. 24, 2020

(54) ION SOURCE

(71) Applicant: Nissin Ion Equipment Co., Ltd., Koka, Shiga (JP)

(72) Inventors: Masakazu Adachi, Koka-city (JP); Shigeki Sakai, Koka-city (JP); Yuya Hirai, Koka-city (JP); Takayuki Murayama, Koka-city (JP); Tomoya Taniguchi, Koka-city (JP); Weijiang Zhao, Koka-city (JP)

(73) Assignee: NISSIN ION EQUIPMENT CO., LTD., Koka, Shiga (JP)

( * ) Notice: Subject to any disclaimer, the term of this patent is extended or adjusted under 35 U.S.C. 154(b) by 0 days.

(21) Appl. No.: 16/353,475

(22) Filed: Mar. 14, 2019

(30) Foreign Application Priority Data

Oct. 26, 2018 (JP) .................................. 2018-201465

(51) Int. Cl.
*H01J 7/24* (2006.01)
*H05B 31/26* (2006.01)
*H01J 27/02* (2006.01)

(52) U.S. Cl.
CPC .................................. *H01J 27/024* (2013.01)

(58) Field of Classification Search
CPC .. H05H 1/48; H05H 1/42; H05H 1/46; H05H 1/24; H01J 61/28; H01J 37/32082; H01J 37/32192; H01J 37/32174; H01J 37/08; H01J 37/3171; H01J 27/18; H01J 27/08; H01J 27/14; H01J 41/04; H01J 41/14; H01J 41/06; H05B 31/0021; F03H 1/0012; H01T 23/00; H01T 19/00
See application file for complete search history.

(56) References Cited

U.S. PATENT DOCUMENTS

| | | | | |
|---|---|---|---|---|
| 2004/0038505 | A1* | 2/2004 | Ito | ............................ H01J 37/08 438/520 |
| 2015/0380526 | A1* | 12/2015 | Godet | ............... H01L 29/66795 438/482 |
| 2016/0351379 | A1* | 12/2016 | Sato | .................. H01J 37/32669 |
| 2018/0247797 | A1* | 8/2018 | Gorokhovsky | ......... C23C 16/27 |

FOREIGN PATENT DOCUMENTS

JP 2016-177870 A 10/2016

* cited by examiner

*Primary Examiner* — Minh D A
(74) *Attorney, Agent, or Firm* — Sughrue Mion, PLLC

(57) ABSTRACT

An ion source is provided. The ion source includes a plasma generation chamber, a plate member, and an extraction electrode. The plasma generation chamber is supplied with a halogen-containing material. The plate member is provided on an end of the plasma generation chamber located on a side toward which an ion beam is extracted. The extraction electrode is disposed downstream of the plate member. The plate member is formed with a gas supply passage via which hydrogen gas is supplied to the extraction electrode.

20 Claims, 10 Drawing Sheets

ION SOURCE

CROSS-REFERENCE TO RELATED APPLICATION

This application claims priority from Japanese Patent Application No. JP2018-201465, filed Oct. 26, 2018 in the Japanese Patent Office, the contents of which are herein incorporated by reference in their entirety.

BACKGROUND

1. Field

Embodiment disclosed herein relate to an ion source which is used for extraction of an ion beam, and more specifically to an ion source capable of stably extracting an ion beam for a long period of time.

2. Description of Related Art

In ion implantation applications, an ion source is provided in which plasma is generated in a plasma chamber using a halogen-containing gas or vapor as a material.

Specific examples of the material for plasma generation include $BF_3$, $PF_3$, $AlI_3$ and $AlCl_3$. A halogen component contained in the material, such as fluorine, iodine or chlorine is ionized along with plasma generation, and the resulting ions react with an inner wall of the plasma chamber and an extraction electrode disposed downstream of the plasma chamber.

Because plasma is generated inside the plasma chamber, an internal temperature of the plasma chamber is relatively high. Thus, even if a product of the above reaction is produced within the plasma chamber, it will be dissociated by heat. On the other hand, it is typical that the extraction electrode disposed downstream of the plasma chamber is cooled for the purpose of preventing thermal strain. Thus, the temperature of the extraction electrode generally becomes relatively less than that of the plasma chamber. For this reason, the reaction product is likely to deposit on the surface of the extraction electrode.

As an operation period of the ion source becomes longer, the amount of deposition of the reaction product increases such that the deposition of the reaction product becomes a factor causing insulation of the extraction electrode and an abnormal electrical discharge between the plasma chamber and the extraction electrode. Thus, an excessive amount of the deposition makes it impossible to normally operate the ion source.

JP 2016-177870A contemplates removing the reaction product deposited on the extraction electrode at a certain stage. However, there is no discussion of how to extend a period of time before removing the reaction product.

SUMMARY

It is an aspect to suppress deposition of a reaction product on an extraction electrode to thereby realize long-term stable operation of an ion source.

According to an aspect of one or more embodiments, there is provided an ion source comprising a plasma generation chamber into which a halogen-containing material is supplied; a plate member on an end of the plasma generation chamber on a side toward which an ion beam is extracted; and an extraction electrode disposed downstream of the plate member, wherein the plate member is formed with a gas supply passage via which hydrogen gas is supplied to the extraction electrode.

According to another aspect of one or more embodiments, there is provided an ion source comprising a plasma generation chamber; a plate member formed with a gas supply passage; and an extraction electrode disposed downstream of the plate member, wherein the plate member is configured to supply hydrogen gas through the gas supply passage to e extraction electrode.

According to yet another aspect of one or more embodiments, there is provided an ion source comprising a plasma generation chamber; an extraction electrode disposed downstream of the plasma generation chamber, and configured to extract an ion beam from the plasma generation chamber; and means for supplying hydrogen gas to the extraction electrode to suppress deposition of a reaction product on the extraction electrode.

BRIEF DESCRIPTION OF THE DRAWINGS

The above and/or other aspects will become apparent and more readily, appreciated from the following description of embodiments, taken in conjunction with the accompanying drawings of which.

DETAILED DESCRIPTION

Although the related art describes a technique for removing a reaction product deposited on an extraction electrode, it does not mention how to extend a period of time before cleaning is required to remove the reaction product, and thus does not provide a technique to stably operate the ion source for a long period of time.

A semiconductor factory handling a mass-produced product requires higher productivity, so that there is a need for long-term stable operation of an ion source.

Figure 1:
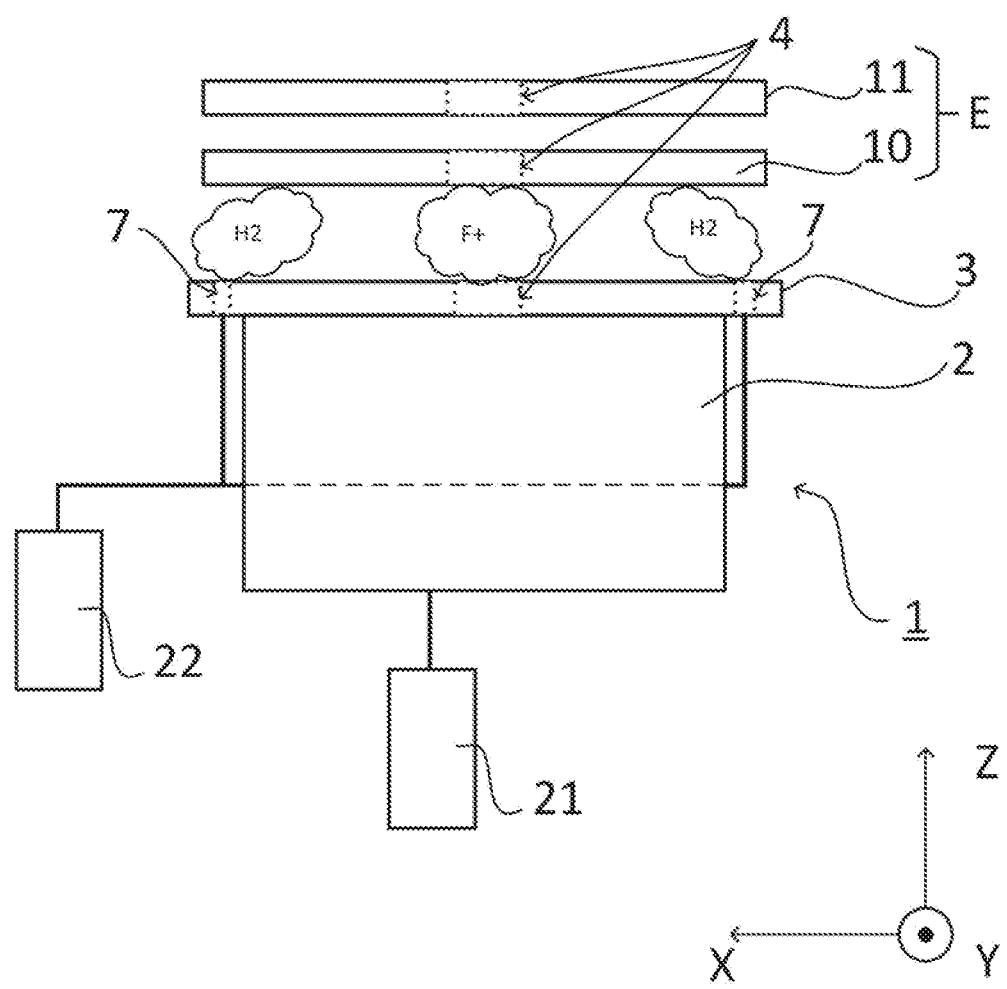
FIG. 1 is a schematic top plan view of an ion source according to an embodiment.

FIG. 1 is a schematic top plan view of an ion source according to an embodiment. The ion source 1 mainly comprises a plasma generation chamber 2, a plate member 3 and an extraction electrode system E.

In FIG. 1, a Z direction is an ion beam extraction direction along which an ion beam is extracted from the ion source 1, and a Y direction is a longitudinal direction of the plasma generation chamber 2. Further, an X direction is a direction orthogonal to the Y direction and the Z direction.

The plate member 3 is a member which is attached to one end of the plasma generation chamber 2 located on a side toward which an ion beam is extracted, and opposed to the extraction electrode system E along the Z direction. That is, the plate member 3 may be provided between the plasma generation chamber 2 and the extraction electrode system E. The plate member 3 includes an ion beam extraction hole 4 through which the ion beam is extracted. In some embodiments, the ion beam extraction hole 4 may be an elongate hole, for example, for extraction of a ribbon ion beam.

In the embodiment shown in FIG. 1, the extraction electrode system E comprises a suppression electrode 10, and a ground electrode 11. Each of the suppression electrode 10 and the ground electrode 11 may include an ion beam extraction hole 4 through which the ion beam that is extracted passes. The extraction electrode system E illustrated in FIG. 1 includes two electrodes. However, the extraction electrode system E is not limited thereto, and in other embodiments may include any other suitable number of electrodes, such as three or four electrodes.

A halogen-containing material (e.g., $BF_3$) is supplied from a dopant gas supply source 21, and plasma thereof is generated within the plasma generation chamber 2 by an arc discharge. The plasma generated n the plasma generation chamber 2 is extracted as an ion beam to the outside of the plasma generation chamber through the extraction electrode system E.

The plate member 3 is formed with a gas supply passage 7, and, via the gas supply passage 7 formed in the plate member 3, hydrogen gas is supplied from a hydrogen gas supply source 22 toward the extraction electrode system E (particularly, toward the suppression electrode 10).

Halogen ions (e.g., fluorine ions) generated in the plasma generation chamber 2 from the halogen-containing material are released toward the extraction electrode system E along with the extraction of the ion beam. In related art ion sources, the released halogen ions react with the extraction electrode system E, and a product of the reaction deposits on the extraction electrode system E.

However, in the ion source according to the embodiment depicted in FIG. 1, hydrogen gas is supplied to the extraction electrode system E via the gas supply passage of the plate member 3, so that it becomes possible to bring the halogen ions into reaction with the hydrogen gas before the halogen ions react with the extraction electrode system E.

As a result, the amount of a reaction product to be produced around the extraction electrodes of the extraction electrode system E decreases and thus the amount of deposition of the reaction product decreases. This reaction makes it possible to extend a period of time before cleaning the extraction electrodes of the extraction electrode system E and thus realize long-term stable operation of the ion source 1.

Here, a reaction product between the halogen ions and the hydrogen gas is formed in the form of gas, i.e., a reacted gas, and discharged to the outside of the ion source 1. For example, in some embodiments, the reacted gas may be discharged via a non-depicted pump.

With reference to FIGS. 2 to 10, various examples of a configuration for supplying hydrogen gas to the extraction electrode system E will be described below.

Figure 2:
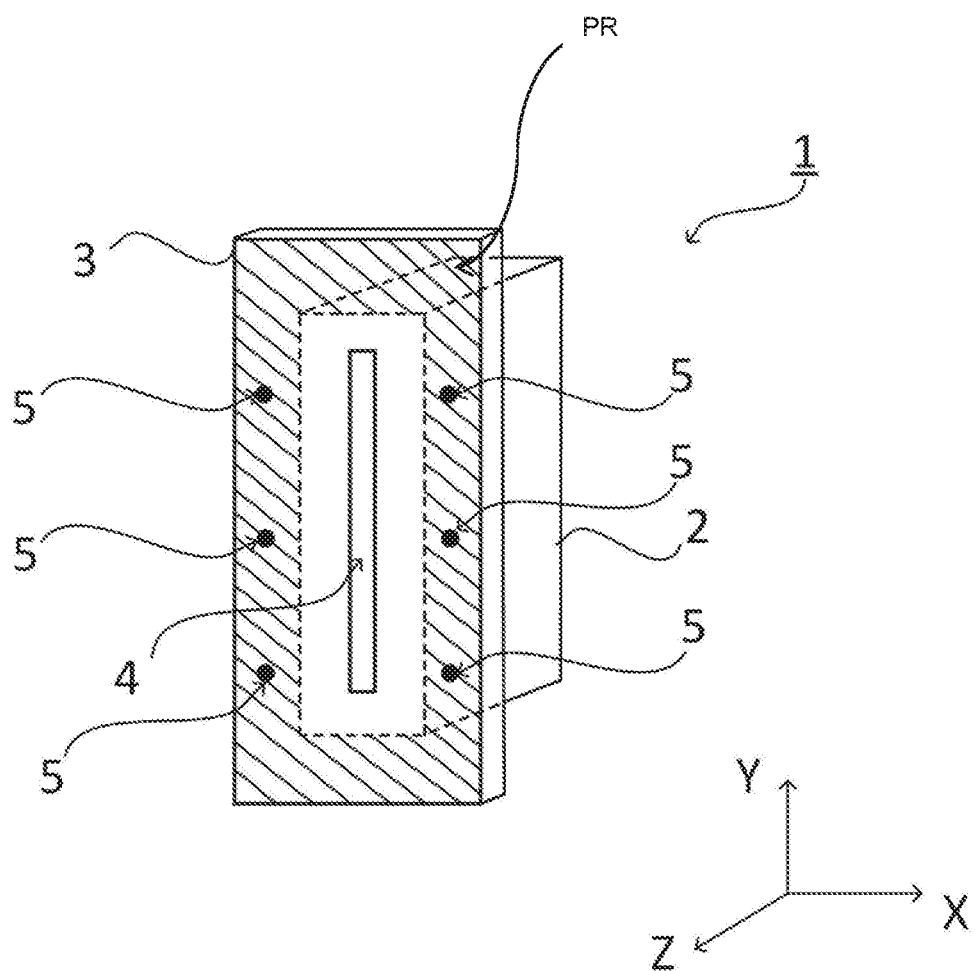
FIG. 2 is a perspective view of the ion source in FIG. 1.

FIG. 2 is a perspective view of the ion source 1 of FIG. 1, wherein depiction of the extraction electrode system E is omitted for convenience of description. As depicted in FIG. 2, the plate member 3 may be formed a plurality of gas ejection openings 5 for ejecting hydrogen gas toward the extraction electrode system E therethrough.

Further, with regard to a relationship between the plate member 3 and the plasma generation chamber 2, the plate member 3 may be configured such that the plate member 3 has a protruding region PR (shown as a hatched region in FIG. 2) which protrudes in the X-Y plane with respect to the plasma generation chamber 2, when viewed from the Z direction. In other words, when comparing the plate member 3 with the plasma generation chamber 2 in terms of dimensional relationship in the X-Y plane, the plate member 3 has a size greater than that of the plasma generation chamber 2.

In the plate member 3 having the protruding region PR, the gas supply passage 7 may be easily formed in various configurations or patterns, using the protruding region PR, and therefore design flexibility regarding the gas supply passage is improved.

Figure 3:
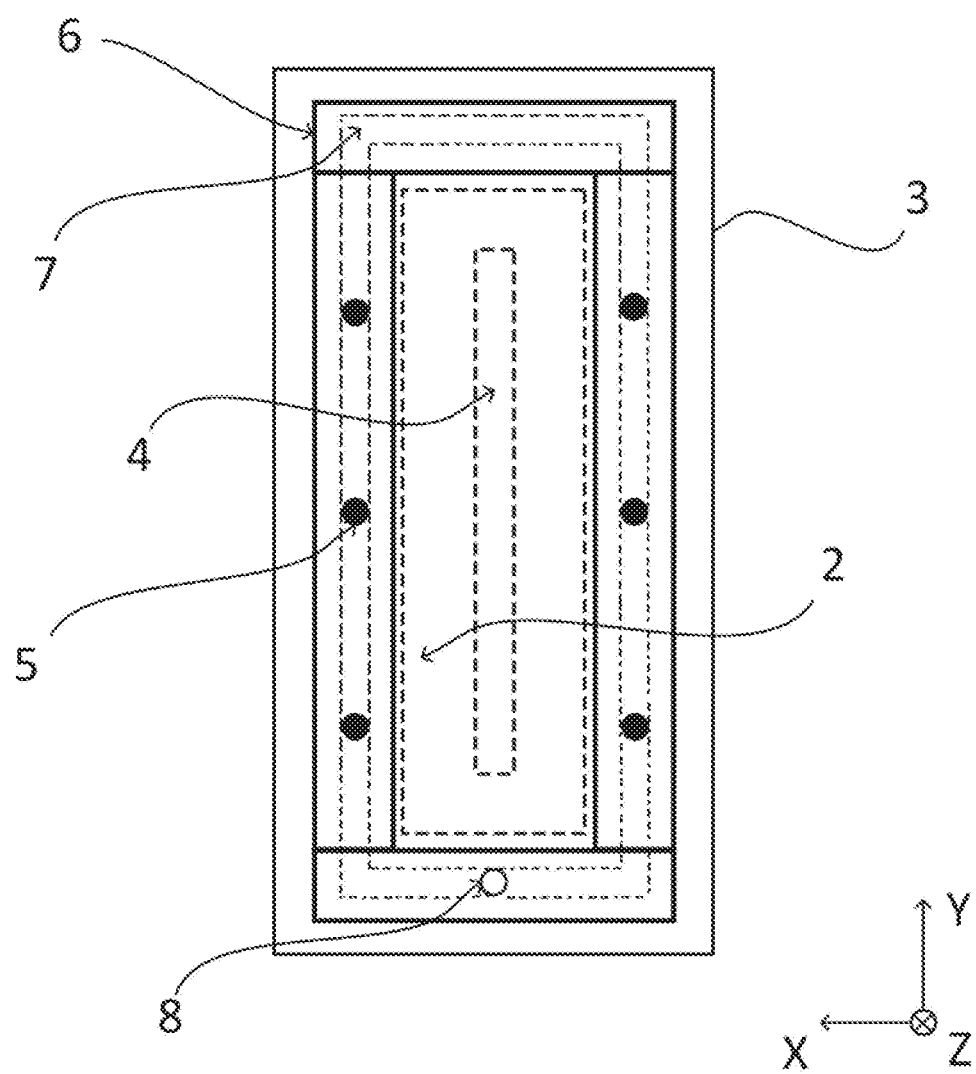
FIG. 3 is a schematic X-Y plan view of an example of a gas introduction ejection configuration of a plate member of the ion source in FIG. 2, according to an embodiment.

FIG. 3 is a schematic X-Y plan view of an example of a gas introduction ejection configuration of the plate member 3 having the protruding region PR depicted in FIG. 2, when viewed from the side of the plasma generation chamber 2. That is, in FIG. 3 the view is from the opposite side as in FIG. 2. In this example, hydrogen gas is introduced into a gas introduction opening 8, and supplied from a plurality of the gas ejection openings 5 to the extraction electrode system E via the gas supply passage 7 formed in the plate member 3. The location of the gas introduction opening 8 is shown at the bottom of the plate member 3 in FIG. 3. However, this is only an example, and the location of the gas introduction opening 8 is not particularly limited. Moreover, while FIG. 3 shows one gas introduction opening 8, the number is not particularly limited and, for example, in some embodiments, more than one gas introduction opening 8 may be provided. See, e.g., FIG. 5 described below.

Figure 4A:
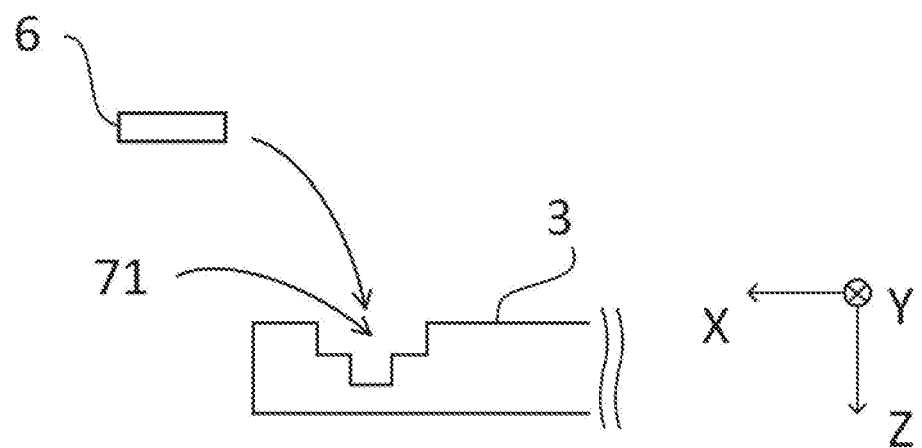
FIGS. 4A and 4B are schematic diagrams for explaining a technique of forming a gas supply passage of the plate member, according to an embodiment.
Figure 4B:
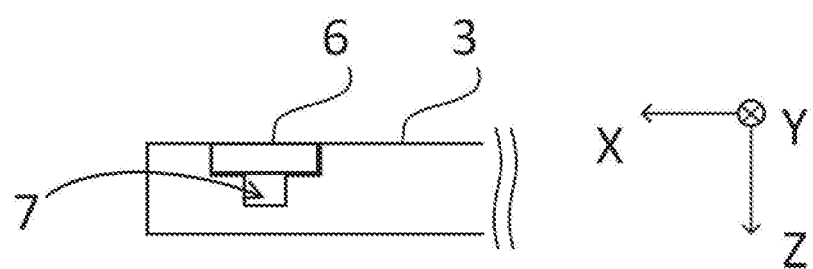

With regard to formation of the gas supply passage 7, although the gas supply passage 7 may be formed, e.g., by making, in the plate member 3, a through-hole extending in one direction, it is advantageous to use a technique as shown in FIGS. 4A and 4B.

FIGS. 4A and 4B are schematic diagrams for explaining a technique of forming a gas supply passage of the plate member, according to an embodiment.

As depicted in FIG. 4A, a stepped concave-shaped groove 71 may be formed in a surface of the plate member 3, and a cover 6 may be installed onto plate member 3 to partially close an opening of the groove. By the installation of the cover 6, the gas supply passage 7 is formed in the plate member 3, as depicted in FIG. 4B.

In the gas supply passage 7 formed using the technique described with reference to FIGS. 4A and 4B, maintenance of the inside of the gas supply passage 7 may be easily performed by detaching the cover 6. Further, this technique is superior in terms of, e.g., capability of allowing the gas supply passage to be easily formed in various configurations or patterns, as compared to a technique of cutting only the inside of the plate member, instead of the surface, to form the gas supply passage.

In the configuration depicted in FIG. 3, the plate member 3 has one gas introduction opening 8. However, this configuration may, in some cases, lead to a situation where distribution of the amount of hydrogen gas supplied to the extraction electrode system E becomes uneven. In such a situation, a gas introduction ejection configuration depicted in FIG. 5 may be employed.

Figure 5:
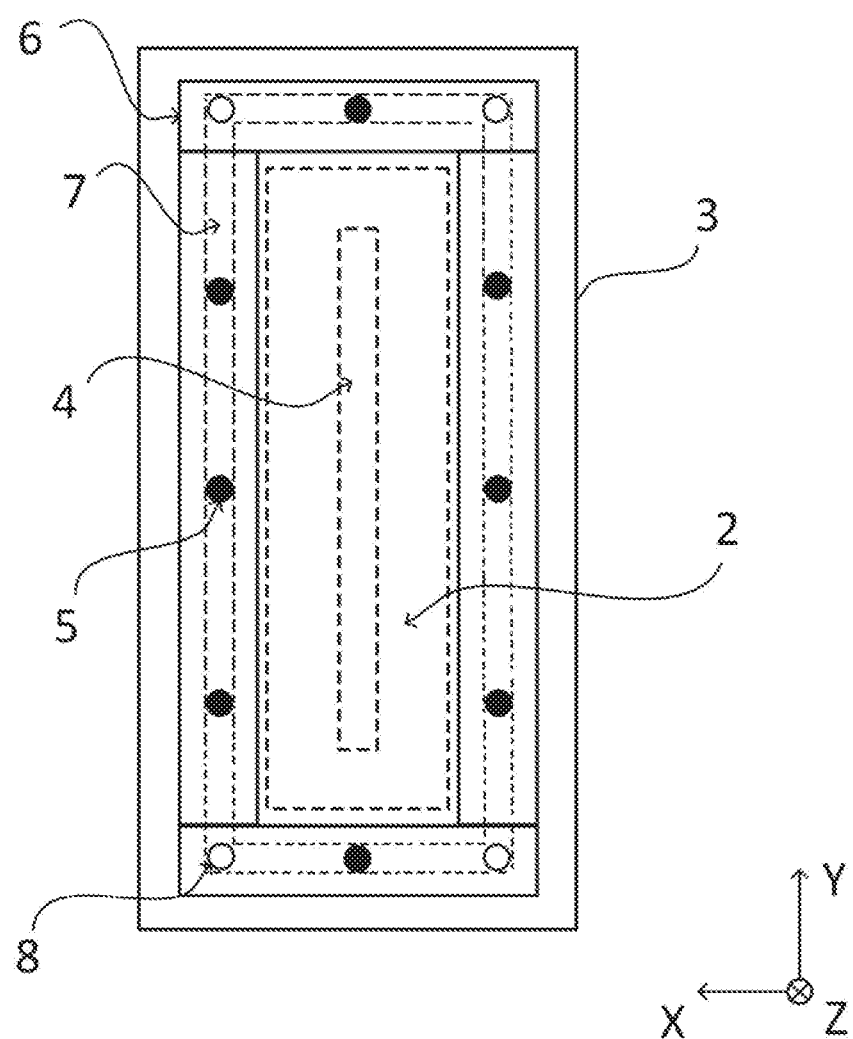
FIG. 5 is a schematic X-Y plan view of another example of the gas introduction ejection configuration, according to an embodiment.

FIG. 5 is a schematic X-Y plan view of another example of the gas introduction ejection configuration, according to an embodiment.

In the example depicted in FIG. 5, a plurality of the gas introduction openings 8 and a plurality of the gas ejection openings 5 are formed in the plate member 3, and are arranged symmetrically laterally and vertically with respect to a center of the ion beam extracting hole 4. This configuration may be employed to eliminate the uneven distribution of the hydrogen gas supply amount.

However, the plate member 3 having the symmetric gas introduction ejection configuration illustrated in FIG. 5 does not necessarily need to be employed. In some embodiments, a plate member having a non-symmetric gas introduction ejection configuration may be employed, e.g., in a situation where it is advantageous to locally increase the hydrogen gas supply amount.

Further, in the configuration depicted in FIG. 3 and FIG. 5, all the gas introduction openings 8, the gas ejection openings 5 and the gas supply passage 7 are provided in the protruding region. However, the embodiments are is not limited thereto.

Figure 6:
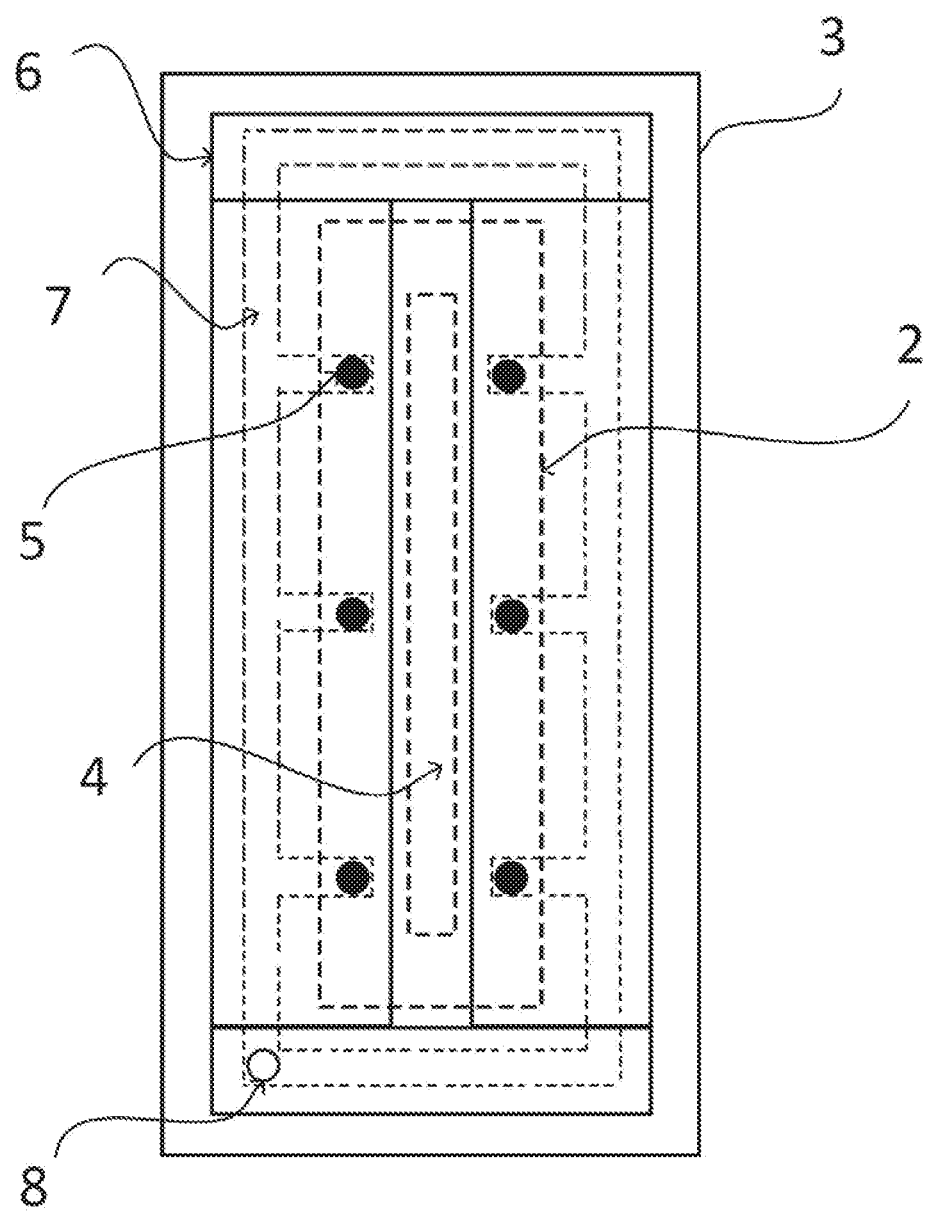
FIG. 6 is a schematic X-Y plan view of yet another example of the gas introduction ejection configuration, according to an embodiment.

FIG. 6 is a schematic X-Y plan view of yet another example of the gas introduction ejection configuration, according to an embodiment.

As depicted in FIG. 6, a remaining region of the plate member 3 other than the protruding region may be partly used such that the gas ejection openings 5 are arranged at positions close to the ion beam extracting hole 4, and the gas supply passage 7 formed in the protruding region is branched into a plurality of sub-passages extending toward the ion beam extracting hole 4 to communicate with respective ones of the gas ejection openings 5.

Figure 7:
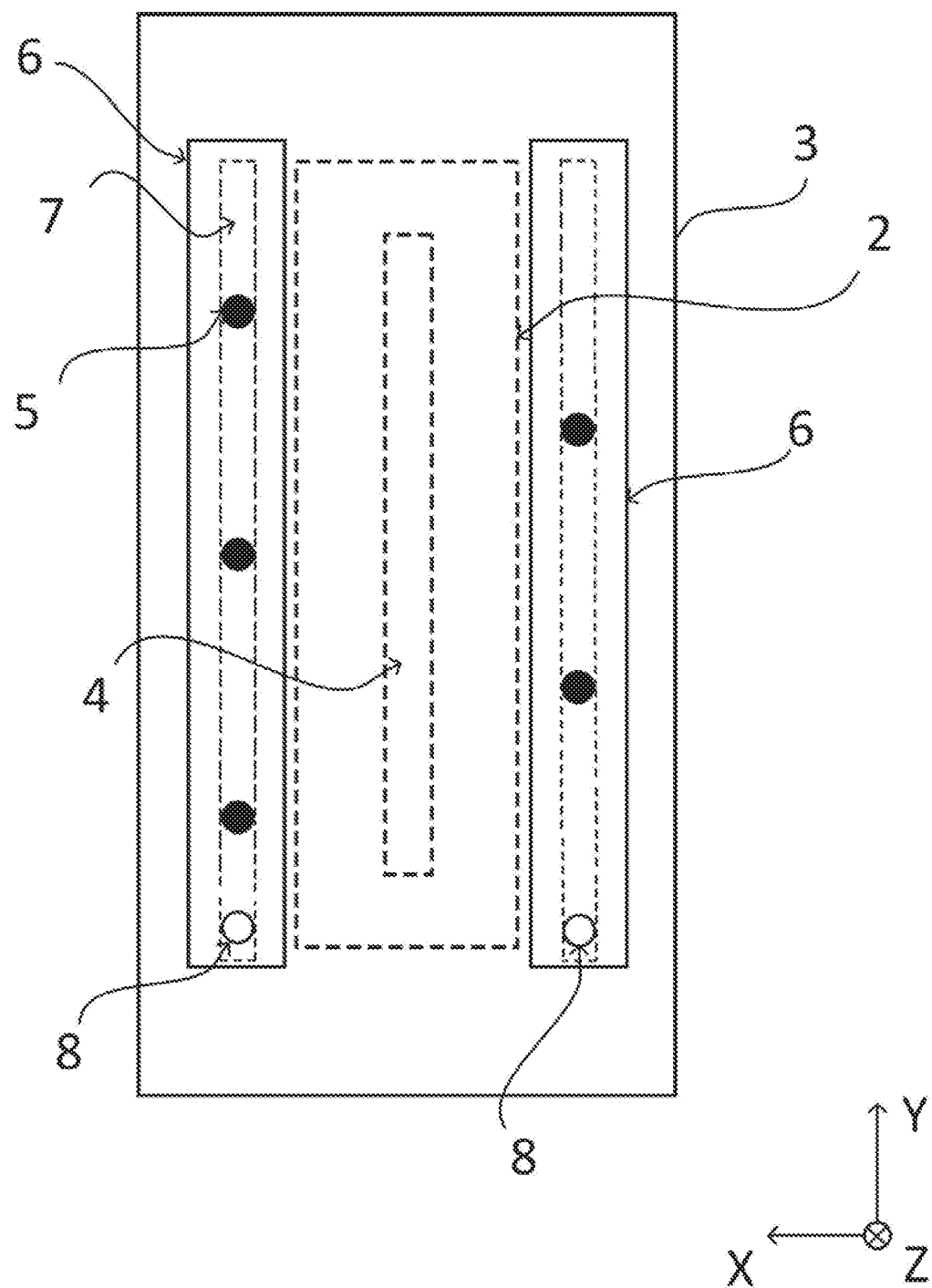
FIG. 7 is a schematic X-Y plan view of still another example of the gas introduction ejection configuration, according to an embodiment.

FIG. 7 is a schematic X-Y plan view of still another example of the gas introduction ejection configuration, according to an embodiment.

Alternatively, as shown in FIG. 7, to reduce the number of the gas ejection openings 5 while widely supplying hydrogen gas in the Y direction, the plate member 3 may be configured such that two portions of the gas supply passage 7 are arranged, respectively, on sides of the ion beam extracting hole 4 to extend along a longitudinal axis of the ion beam extracting hole 4 (i.e., to extend in the Y direction in FIG. 6), and two or more gas ejection openings 5 provided in one of the portions of the gas supply passage 7 are arranged in a zigzag pattern with respect to two or more gas ejection openings 5 provided in the other portion of the gas supply passage 7.

Further, the gas supply passage 7 need not be formed in the plate member 3 to surround the ion beam extracting hole 4, but may be formed with respect to only a part of the ion beam extracting hole 4. For example, a plurality of gas supply passages 7 may be formed in the plate member 3 to surround only a part of the ion beam extracting hole 4.

In the above examples illustrated with respect to FIGS. 3-7, the plate member 3 has the protruding region PR provided with respect to the plasma generation chamber 2. However, in some embodiments, the protruding region PR may be omitted from the plate member 3. In this configuration, in terms of dimensional relationship in the X-Y plane, the plate member 3 may have a size equal to or less than that of the plasma generation chamber 2.

Figure 8:
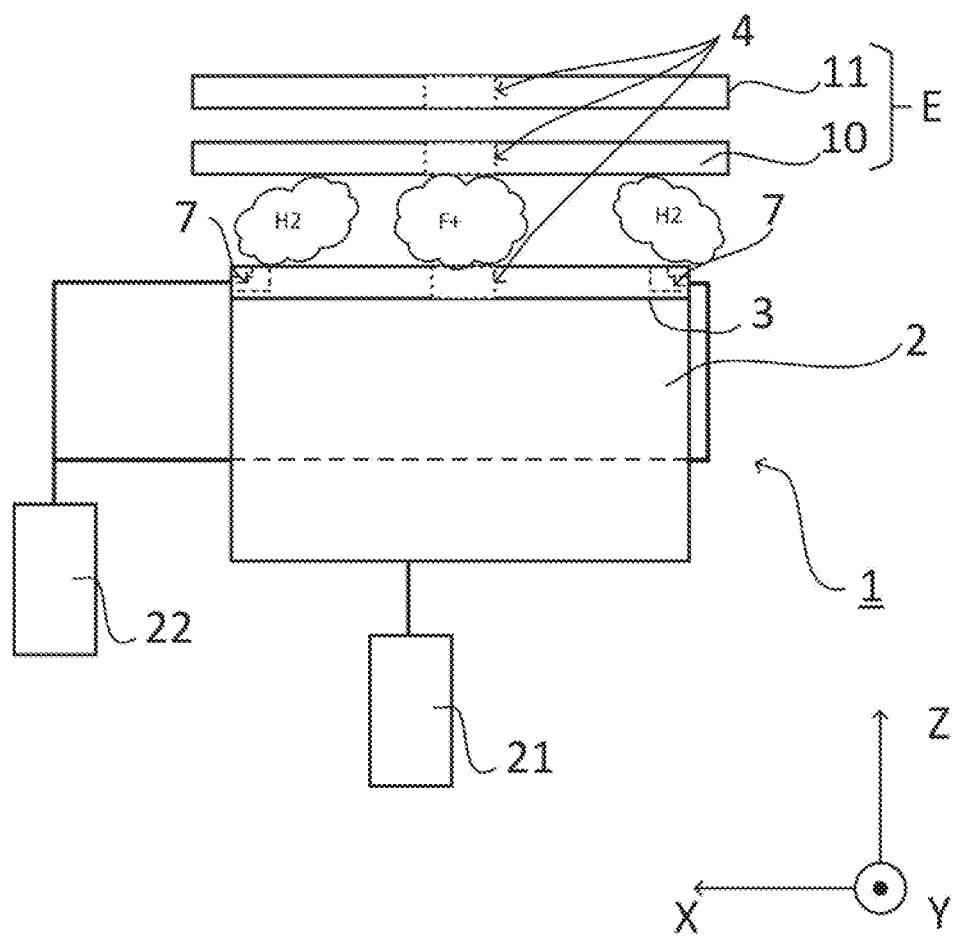
FIG. 8 is a schematic top plan view of an example of a modification of the plate member, according to an embodiment.

FIG. 8 is a schematic top plan view of an example of a modification of the plate member, according to an embodiment.

Figure 9A:
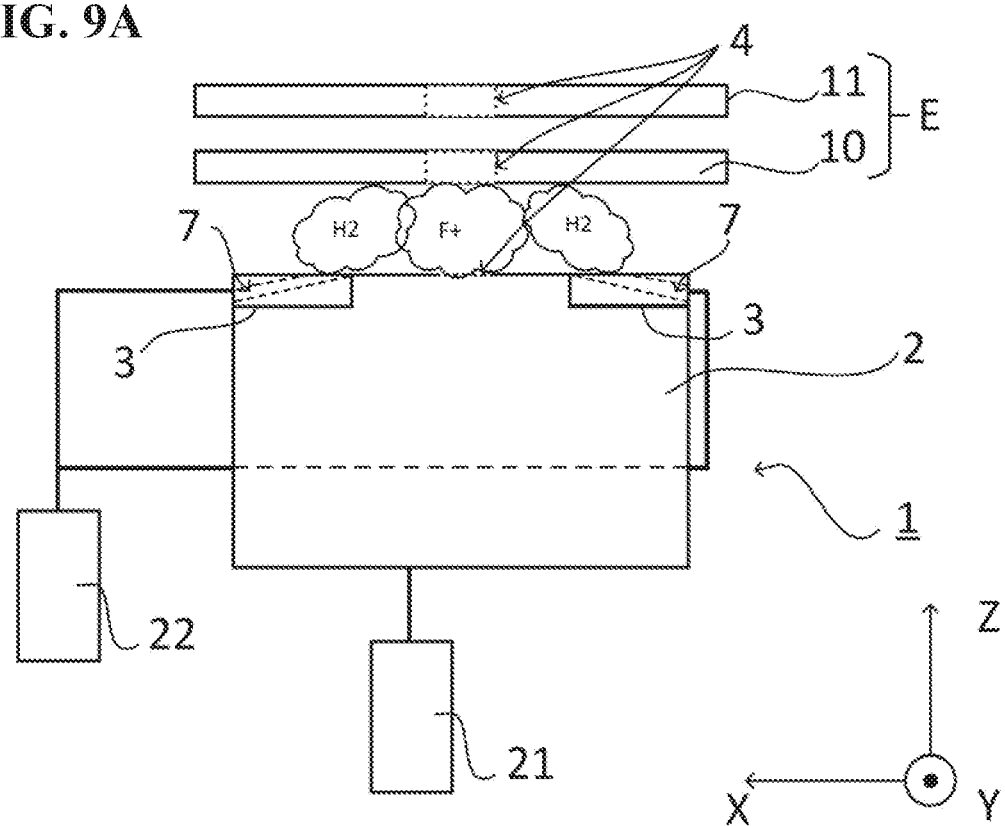
FIGS. 9A and 9B are, respectively, a schematic top plan view and a schematic X-Y plan view of another example of the modification of the plate member, according to an embodiment.
Figure 9B:
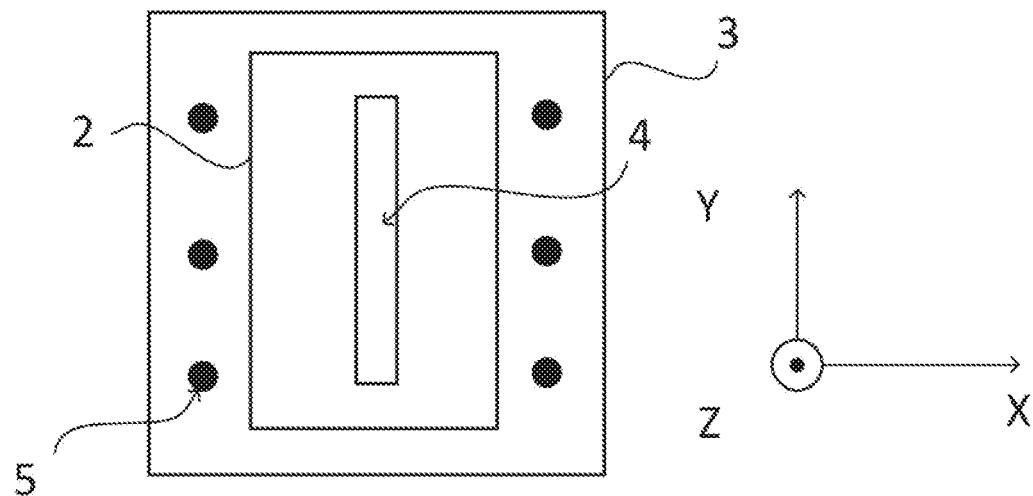

In two examples depicted in FIGS. 8 and 9A and 9B, the plate member 3 has no protruding region. As seen in these examples, hydrogen gas may be introduced into the plate member 3 from one edge face of the plate member 3 facing in the X direction.

In the above examples illustrated in FIGS. 1-8, the ion beam extracting hole 4 is formed in not only the plasma generation chamber 2 but also the plate member 3. However, the embodiments are not limited thereto.

FIGS. 9A and 9B are, respectively, a schematic top plan view and a schematic X-Y plan view of another example of the modification of the plate member, according to an embodiment. For example, as depicted in FIGS. 9A and 9B, the plasma generation chamber 2 may be configured such that a central region of one end thereof protrudes toward the extraction electrode system E, and the plate member 3 may be configured such that the plate member 3 is disposed to surround the protruding central region to have an external surface which is flush with that of the protruding central region. In the configuration illustrated in FIGS. 9A and 9B, the ion beam extracting hole 4 may be omitted in the plate member 3.

FIGS. 9A and 9B illustrate the gas supply passage 7 as a linear shape extending from the side facing the X-direction to the side facing the Z-direction. However, the embodiment is not limited thereto. As the shape of the gas supply passage 7, it is possible to employ a curved shape as well as a linear shape or a cranked shape. Further, the gas supply passage 7 does not need to be formed as a path parallel to the X or Z direction. For example, as depicted in FIG. 9A, the gas supply passage 7 may be formed to extend obliquely, upwardly toward an ion beam extracting hole 4 of the extraction electrode system E.

In the related art, an abnormal electrical discharge between the plasma chamber 2 and the extraction electrode system E may occur due to a deposit formed around the ion beam extracting hole 4 of the extraction electrode system E. Thus, in various embodiments disclosed herein, by supplying hydrogen gas toward the ion beam extracting hole 4 of the extraction electrode system E, it becomes possible to effectively suppress the formation of a deposit around the ion beam extracting hole 4 of the extraction electrode system E.

As a means to supply hydrogen toward the ion beam extracting hole 4 of the extraction electrode system E, the gas supply passage 7 does not need to be formed to extend obliquely with respect to the X or Z direction. For example, as depicted in FIG. 8, the gas supply, passage 7 may be formed in a cranked shape to allow the gas ejection openings 5 to be arranged at positions opposed to the vicinity of the ion beam extracting hole 4 of the extraction electrode system E.

Although the above examples have been described based on an example in which hydrogen gas is introduced into the plate member 3 from the outside of the plasma generation chamber 2, and supplied to the extraction electrode system E via the gas supply passage 7 of the plate member 3, hydrogen gas may be introduced into the plasma generation chamber 2, in addition to being introduced into the plate member 3. This example is depicted in FIG. 10.

Figure 10:
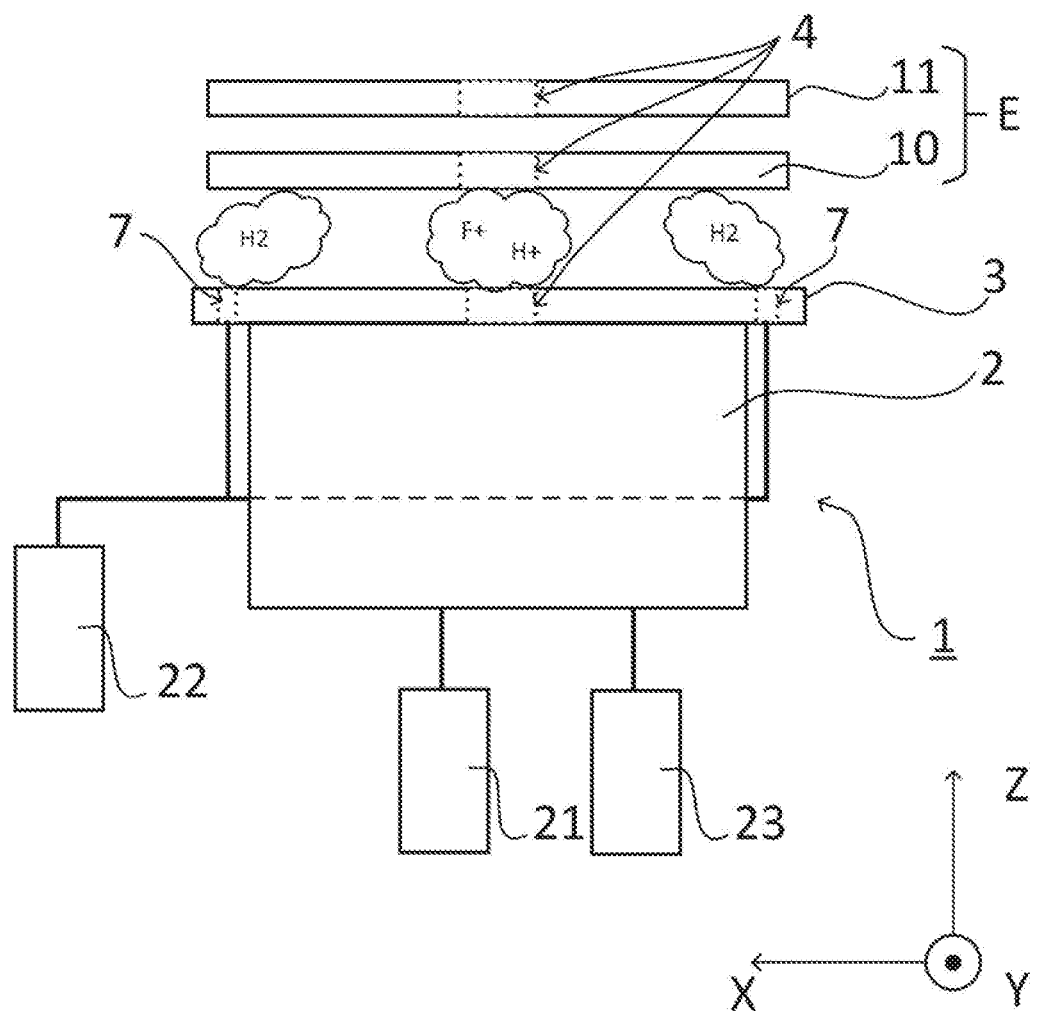
FIG. 10 is a schematic top plan view of an example of a modification of the ion source in FIG. 2, wherein hydrogen gas is additionally supplied to a plasma generation chamber, according to an embodiment.

FIG. 10 is a schematic top plan view of an example of a modification of the ion source in FIG. 2, wherein hydrogen gas is additionally supplied to a plasma generation chamber, according to an embodiment.

An ion source 1 depicted in FIG. 10 comprises a hydrogen gas supply source 23 for introducing hydrogen gas into the plasma generation chamber 2, in addition to the components of the ion source in FIG. 1, a repeated description thereof being omitted for conciseness. When hydrogen gas is supplied into the plasma generation chamber 2, the supplied hydrogen gas is ionized.

For example, when a halogen-containing gas (e.g., $BF_3$) is supplied from the dopant gas supply source 21 to the plasma generation chamber 2, fluorine ions F+ and hydrogen ions H+ are released during ion beam extraction, as depicted in FIG. 10.

Although the fluorine ions may bind to hydrogen ions $H_2$ supplied from the gas supply passage 7 to suppress deposition of fluorides on the extraction electrode system E, deposition of fluorides on the extraction electrode system E may occur significantly, depending on the amount of fluorine ions at an area to which hydrogen gas is supplied or the amount of fluorine ions released from the plasma generation chamber 2.

Even in such a situation, by additionally supplying hydrogen gas into the plasma generation chamber 2, the supplied hydrogen gas may act on fluorides on the surface of the extraction electrode system E to remove the fluorides deposited on the extraction electrode system E.

The halogen-containing material described in the above examples may be supplied from the dopant gas supply source directly to the plasma generation chamber 2 in the form of gas, or may be supplied to a vaporizer in the form of solid, and, after being vaporized through the vaporizer, supplied to the plasma generation chamber 2. Specific examples of the halogen-containing material may include $BF_3$, $PF_3$, $AlI_3$ and $AlCl_3$.

The shapes of the plasma generation chamber 2 and the plate member 3 are not particularly limited. For example, the shapes may be, respectively, a rectangular parallelepiped shape and a rectangular tube, or a cylindrical shape and a disc shape.

With regard to gas supply to the plasma generation chamber 2, FIG. 10 depicts a configuration in which the halogen-containing gas and the hydrogen gas are supplied separately from the dopant gas supply source 21 and the hydrogen gas supply source 23, respectively. Alternatively, the gases may be mixed together prior to supply of the two gases to the plasma generation chamber 2, at a halfway point of a gas supply path, and the resulting mixed gas may be supplied to the plasma generation chamber 2.

Further, without adding a new supply source, the hydrogen gas supply source 22 equipped in the ion source 1 of FIGS. 1-9B may be used to supply hydrogen gas to both the plasma generation chamber 2 and the plate member 3.

In the above embodiments, hydrogen gas is supplied to the extraction electrode system E. In this case, hydrogen gas does not need to be supplied to all of the plurality of electrodes comprising the extraction electrode system E. In fact, a reaction product tends to more easily deposit on the suppression electrode 10 located at the nearest position with respect to the plasma generation chamber 2. Thus, in some embodiments, for example, hydrogen gas may be supplied only to the suppression electrode 10.

Further, the above embodiments have been described based on an example in which the plate member 3 is formed with a plurality of holes serving as the gas ejection openings 5. Alternatively, in some embodiments, the plurality of holes may be combined as a single elongate hole.

Further, the plate member 3 and the plasma generation chamber 2 may be formed as separate components. Alternatively, the plate member 3 and the plasma generation chamber 2 may be integrally formed. Alternatively, the plate member 3 may be formed to additionally serve as a part of the plasma generation chamber 2. For example, the plasma generation chamber 2 may be configured such that one end thereof facing the extraction electrode system E is formed as an open end, and this open end is closed by the plate member 3. In this way, the plate member 3 may additionally serve as one end wall of the plasma generation chamber 2 to reduce a component cost.

In the ion source according to various embodiments described above, an ionized halogen component reacts with the hydrogen gas supplied to the extraction electrode, before reacting with the extraction electrode, so that it is possible to suppress deposition of a reaction product on the extraction electrode. This suppression makes it possible to extend a period of time before cleaning the extraction electrode and thus realize long-term stable operation of the ion source.

In some embodiments, the plate member may be a wall of the plasma generation chamber.

According to this configuration, the plate member may be additionally used as a part of the wall of the plasma generation chamber, so that it is possible to reduce the number of components of the plasma generation chamber.

In some embodiments, the plate member may have a protruding region which protrudes with respect to the plasma chamber, when viewed from a direction along which the ion beam is extracted, and the hydrogen gas may be introduced into the protruding region.

According to this configuration, the gas supply passage may be easily formed in various configurations or patterns, using the protruding region.

In some embodiments, a part of the gas supply passage may be define by a groove formed in the plate member, and a cover closing an opening of the groove.

According to this configuration, it becomes possible to facilitate formation and maintenance of the gas supply passage, In some embodiments, the extraction electrode may be formed with an ion beam extracting hole for extracting the ion beam therethrough, and the plate member may be configured to supply the hydrogen gas toward the hole.

As described above, in the related art, an abnormal electrical discharge between the plasma chamber and the extraction electrode may occur due to a deposit formed around the ion beam extracting hole of the extraction electrode. According to various embodiments disclosed herein, by supplying the hydrogen gas toward the ion beam extracting hole of the extraction electrode, it becomes possible to effectively suppress the formation of a deposit around the ion beam extracting hole and thus suppress the occurrence of the abnormal electrical discharge.

In the ion source according to various embodiments described above, when the extraction electrode is formed with an ion beam-extracting elongate hole, the plate member may be formed with one or more hydrogen gas ejection openings along a longitudinal direction of the elongate hole.

In some embodiments, the ion source may comprise a supply source which supplies hydrogen gas into the plasma generation chamber.

In the ion source according to various embodiments described above, an ionized halogen component reacts with the hydrogen gas supplied to the extraction electrode, before reacting with the extraction electrode, so that it is possible to suppress deposition of a reaction product on the extraction electrode. This suppression makes it possible to extend a period of time before cleaning the extraction electrode and thus realize long-term stable operation of the ion source It should be understood that the present disclosure is not limited to the above embodiments, but various other changes and modifications may be made therein without departing from the spirit and scope of the disclosure as set forth in the appended claims.

What is claimed is:

1. An ion source comprising:
   a plasma generation chamber into which a halogen-containing material is supplied;
   a plate member on an end of the plasma generation chamber on a side toward which an ion beam is extracted; and
   an extraction electrode disposed downstream of the plate member,
   wherein the plate member is formed with a gas supply passage via which hydrogen gas is supplied to the extraction electrode.

2. The ion source as recited in claim 1, wherein the plate member constitutes a wall of the plasma generation chamber.

3. The ion source as recited in claim 1, wherein the plate member has a protruding region which protrudes with respect to the plasma generation chamber, when viewed from a direction along which the ion beam is extracted, and
   wherein the hydrogen gas is introduced into the protruding region.

4. The ion source as recited in claim 1, wherein a part of the gas supply passage is defined by a groove formed in the plate member, and a cover closing an opening of the groove.

5. The ion source as recited in claim 1, wherein the extraction electrode comprises an extracting hole through which the ion beam is extracted, and
   wherein the plate member is configured to supply the hydrogen gas toward the extracting hole.

6. The ion source as recited in claim 1, wherein the extraction electrode comprises an elongate hole, and
   wherein the plate member comprises one or more hydrogen gas ejection openings along a longitudinal direction of the elongate hole.

7. The ion source as recited in claim 1, further comprising a supply source which supplies hydrogen gas into the plasma generation chamber.

8. The ion source as recited in claim 1, wherein the plate member is attached to the plasma generation chamber on the side on which the ion beam is extracted.

9. The ion source as recited in claim 1, further comprising a source gas supply passage via which the halogen-containing material is supplied to the plasma generation chamber.

10. An ion source comprising:
    a plasma generation chamber;
    a plate member formed with a gas supply passage; and
    an extraction electrode disposed downstream of the plate member,
    wherein the plate member is configured to supply hydrogen gas through the gas supply passage to the extraction electrode.

11. The ion source as recited in claim 10, wherein the plate member comprises a plurality of gas ejection openings in communication with the gas supply passage, the hydrogen gas being supplied to the extraction electrode through the gas ejection openings.

12. The ion source as recited in claim 11, wherein the gas ejection openings are elongate.

13. The ion source as recited in claim 11, wherein the plate member comprises at least one gas introduction opening in communication with the gas supply passage, the hydrogen gas being introduced into the gas supply passage through the at least one gas introduction opening.

14. The ion source as recited in claim 10, wherein the plate member comprises at least one gas introduction opening in communication with the gas supply passage, the hydrogen gas being introduced into the gas supply passage through the at least one gas introduction opening.

15. The ion source as recited in claim 10, wherein the plate member has a groove formed therein, and a cover covering the groove to define the gas supply passage.

16. The ion source as recited in claim 10, wherein the plate member constitutes a wall of the plasma generation chamber.

17. The ion source as recited in claim 10, wherein the plate member is attached to the plasma generation chamber.

18. The ion source as recited in claim 10, wherein the plate member is provided downstream of the plasma generation chamber between the plasma generation chamber and the extraction electrode.

19. The ion source as recited in claim 10, further comprising a source gas supply passage that supplies a source gas to the plasma generation chamber.

20. An ion source comprising:
    a plasma generation chamber;
    an extraction electrode disposed downstream of the plasma generation chamber, and configured to extract an ion beam from the plasma generation chamber; and
    means for supplying hydrogen gas to the extraction electrode to suppress deposition of a reaction product on the extraction electrode.

* * * * *